US 6,593,067 B2

(12) United States Patent
Lee et al.

(10) Patent No.: US 6,593,067 B2
(45) Date of Patent: Jul. 15, 2003

(54) METHOD FOR MANUFACTURING A MICROSTRUCTURE BY USING A HIGH ENERGY LIGHT SOURCE

(75) Inventors: Seung Seob Lee, Pohang (KR);
Sung-Keun Lee, Pohang (KR);
Kwang-Cheol Lee, Pohang (KR)

(73) Assignee: Postech Foundation, Kyungsangbuk-do (KR)

( * ) Notice: Subject to any disclaimer, the term of this patent is extended or adjusted under 35 U.S.C. 154(b) by 0 days.

(21) Appl. No.: 10/062,528

(22) Filed: Feb. 5, 2002

(65) Prior Publication Data
US 2003/0012332 A1 Jan. 16, 2003

(30) Foreign Application Priority Data

Jul. 10, 2001 (KR) .......................... 2001-41122
Nov. 19, 2001 (KR) .......................... 2001-71691

(51) Int. Cl.[7] ............................... G03F 7/20
(52) U.S. Cl. ................ 430/321; 430/330; 430/945; 430/967; 264/2.5
(58) Field of Search .................. 430/321, 945, 430/967, 330; 264/1.36, 1.37, 2.5

(56) References Cited

U.S. PATENT DOCUMENTS 4,572,611 A * 2/1986 Bellman et al. ............ 350/167
4,877,717 A * 10/1989 Suzuki et al. .............. 430/321
5,604,635 A * 2/1997 Lawandy ................... 359/620
5,665,136 A * 9/1997 Komachi .................... 65/102
6,387,578 B1 * 5/2002 Lian et al. .................. 430/11

FOREIGN PATENT DOCUMENTS

JP         8-171099 A    *  7/1996

OTHER PUBLICATIONS

Borrelli et al., "Photolytic Technique for Producing Microlenses in Photosensitive Glass", Applied Optics vol. 24, No. 16, pp. 2520–2525, Aug. 15, 1985.*

* cited by examiner

Primary Examiner—John A. McPherson
(74) Attorney, Agent, or Firm—Bacon & Thomas, PLLC

(57) ABSTRACT

A method for manufacturing a microstructure by using an X-ray includes the steps of selectively exposing a portion of a photosensitive material to the high energy light source, the selectively exposing step being carried out by using a photomask for defining a pattern of the microstructure and performing a heat-treatment for melting and deforming only an upper portion of the exposed portion of the photosensitive material, the upper portion of the exposed portion of the photosensitive material being exposed at an energy level between about 1 kJ/cm$^3$ and about 20 kJ/cm$^3$, when being exposed to the X-ray.

10 Claims, 9 Drawing Sheets

METHOD FOR MANUFACTURING A MICROSTRUCTURE BY USING A HIGH ENERGY LIGHT SOURCE

FIELD OF THE INVENTION

The present invention relates to a method for manufacturing a microstructure by using a high energy light source; and, more particularly, to a method for manufacturing a microlens or a microstructure having a predetermined pattern by using synchrotron radiation.

DESCRIPTION OF THE PRIOR ART

Recently, high energy synchrotron radiation has been widely used in the field of X-ray lithography in the semiconductor industry and also in manufacturing microstructures by using the so-called LIGA (X-ray deep etching molding) process first developed in Germany in the course of manufacturing a slot nozzle to separate a uranium isotope.

The synchrotron radiation is a high energy light source, tens of thousand times stronger than other light sources. It has a low dispersion due to excellent parallel beam characteristics and also has the continuous energy spectrum and further is a highly clean light source to radiate under high vacuum. Accordingly, a lithographic exposure time can be significantly reduced by way of using the synchrotron radiation, when compared with other light sources. The microstructure having a high aspect ratio can be manufactured by the synchrotron radiation due to its low dispersion characteristic. The synchrotron radiation also can be an optimum X-ray light source in the LIGA method since it can increase the degree of freedom in the selection of a photomask by choosing an appropriate wavelength range therefor.

One of the applications of the LIGA process can be found in the field of a microlens. The microlens is used as an important element in an optical system, wherein the structure of the microlens needs to be controlled so as to obtain desired optical properties.

One of the conventional microlens manufacturing schemes, proposed by N. Moldovan in "LIGA AND ALTERNATIVE TECHNIQUE FOR MICROOPTICAL COMPONENTS", IEEE, page 149~152, 1997, will now be described with reference to FIGS. 1A to 1D.

As shown in FIG. 1A, a photosensitive material, e.g., (PMMA: polyMethylMethAcrylate), 12 is coated on a substrate 10. Thereafter, an X-ray exposure process is performed using an X-ray photomask 14. The PMMA is often used as the photosensitive material 12 since the transparency of the lens manufactured by the PMMA is about 90% better than those of other prior art plastic lenses and other optical characteristics thereof are also closer to those of a glass.

Thereafter, a cylindrical pattern 16 is obtained by eliminating a portion of the PMMA exposed to the X-ray, as shown in FIG. 1B, by a developing process.

The whole cylindrical pattern 16 is then exposed to a second X-ray of a lower intensity provided through a membrane filter (not shown) located thereabove, as shown in FIG. 1C.

By exposing the pattern 16 to the weaker second X-ray, only a surface portion 16a of the pattern 16 is affected to have a lower glass transition temperature ($T_g$) than that of the nonexposed portion.

Finally, as shown in FIG. 1D, the cylindrical pattern 16 is heat-treated at a predetermined temperature so that only the affected surface portion 16a of the exposed cylindrical pattern 16 having low $T_g$ melts and deforms to form a microlens 16b having a hemispherical top portion by a surface tension. Here, the diameter of the microlens 16b is determined by the diameter of the original pattern 16, while the height thereof is determined by the heat-treatment temperature and the height and the diameter of the pattern 16.

However, the conventional microlens manufacturing method described above has some drawbacks in that the manufacturing schemes require two X-ray exposure processes together with a developing process, complicating the whole process.

SUMMARY OF THE INVENTION

It is, therefore, an object of the present invention to provide a simplified microstructure manufacturing method by using only one X-ray exposure process, without being subjected to a developing process.

In accordance with the present invention, there is provided a method for manufacturing a microstructure by using a high energy light source, which includes the steps of selectively exposing a portion of a photosensitive material to the high energy light source and performing a heat-treatment for melting and deforming only an upper portion of the exposed portion of the photosensitive material.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The preferred embodiments of the present invention will now be described with reference to FIGS. 2A to 6B.

In accordance with a first preferred embodiment of the present invention, a microlens can be manufactured by using the X-ray representing a high energy light source.

Figure 1A:
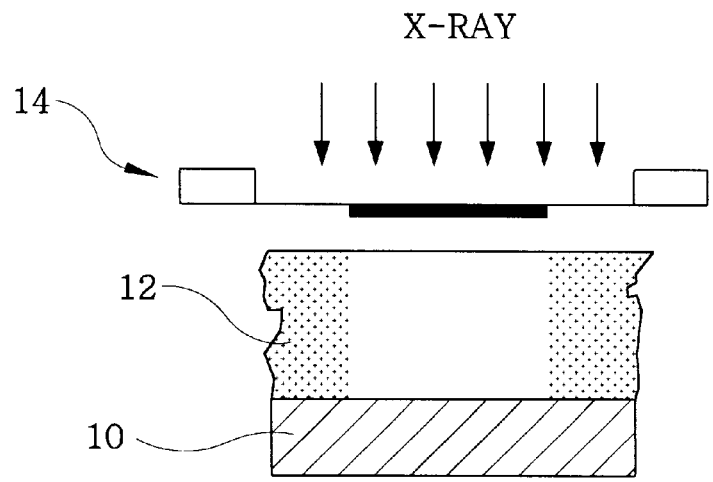
FIGS. 1A to 1D show a conventional microlens manufacturing sequence.
Figure 1B:
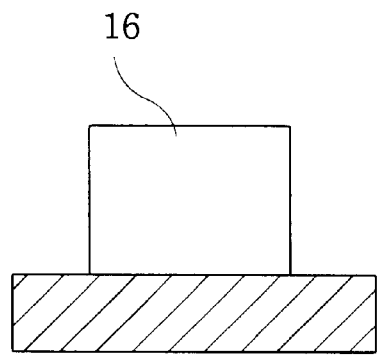
Figure 1C:
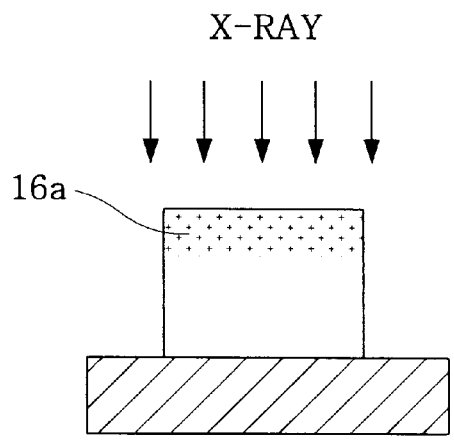
Figure 1D:
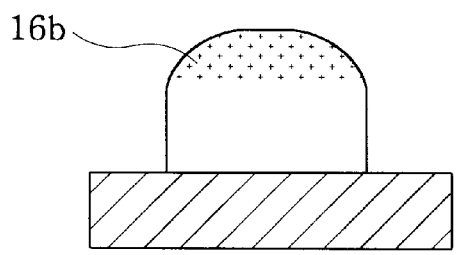
Figure 2A:
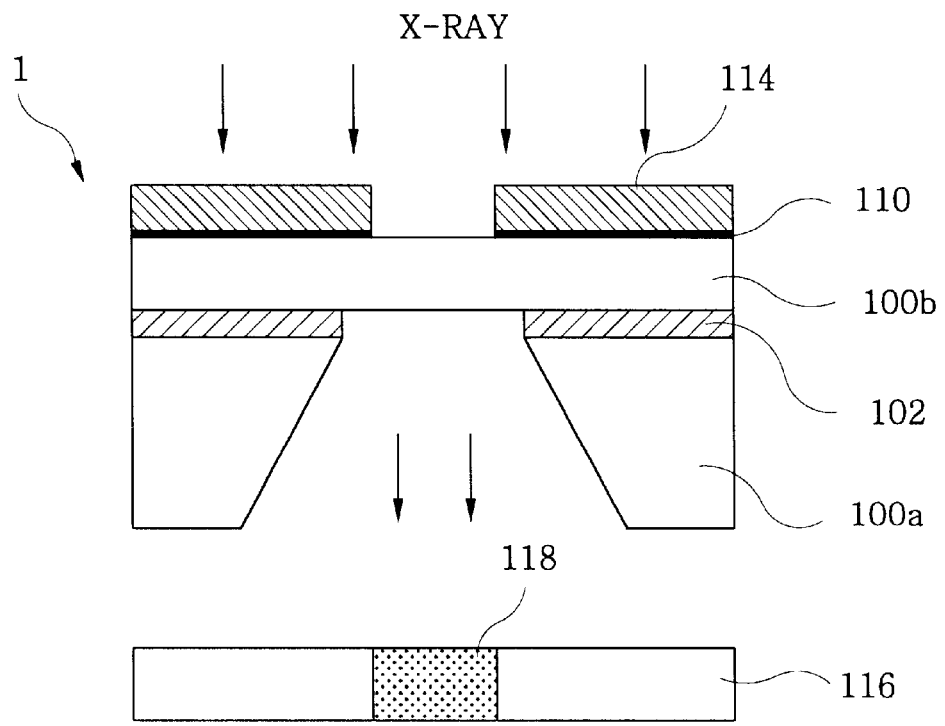
FIGS. 2A and 2B represent a microlens manufacturing sequence in accordance with a first preferred embodiment of the present invention.
Figure 2B:
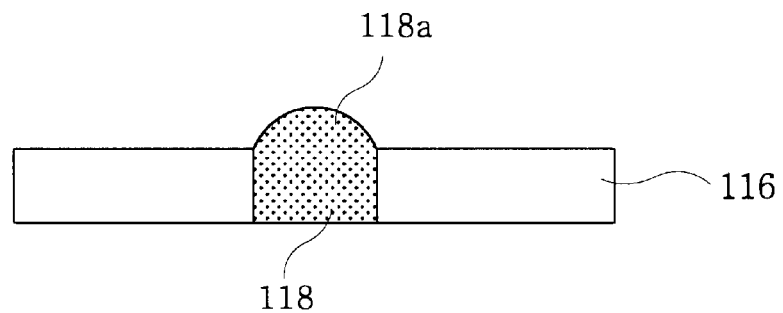

FIGS. 2A and 2B represent a microlens manufacturing sequence in accordance with the first preferred embodiment of the present invention. A single microlens or a plurality of microlenses in the form of an array can be manufactured by the present invention. For the sake of simplicity, however, only one microlens is depicted in FIGS. 2A and 2B.

Referring to FIG. 2A, the X-ray exposure process is performed by using an X-ray photomask 1 having a nontransparent pattern 114 defining a predetermined area for forming the microlens. Reference numerals 110, 100b, 102, 100a represent a metallic layer, a top silicon layer, an insulation layer and a bottom silicon layer, respectively. Details thereof will be described hereinafter with reference to FIGS. 5A–5F.

A photosensitive material 116 is exposed to the X-ray passing through a transparent portion of the photomask 1. The PMMA is preferably used as the photosensitive material 116 in accordance with the first preferred embodiment of the present invention. A Zeonex, a photodefinable glass or the like also can be equally used instead of the PMMA, as long as it can be photolithographically definable and provide desired optical properties. In the X-ray exposure process, the exposed portion 118 of the photosensitive material 116 is exposed to the X-ray.

In accordance with the first preferred embodiment of the present invention, only the upper portion of the exposed portion 118 is significantly affected by the X-ray generated from a particle accelerator with an energy level of 1 kJ/cm$^3$ to 20 kJ/cm$^3$, preferably 2.4 kJ/cm$^3$. By the exposure process described above, the molecular weight of the exposed portion 118 becomes different from that of the remaining nonexposed portion of the photosensitive material 116. Specifically, the molecular weight of the polymer of the upper portion of the exposed portion 118 becomes smaller than that of the nonexposed portion; and, accordingly, the $T_g$ thereof becomes lower than that of the nonexposed portion of the photosensitive material 116.

The upper portion of the exposed portion 118 is then melted and deformed by the heat-treatment to form a hemispherical microlens 118a, while the nonexposed portion of the photosensitive material 116 remains intact, as shown in FIG. 2B. The heat-treatment is performed at a temperature preferably between 50° C. and 250° C. and more preferably between 110° C. and 120° C., for 5 to 10 minutes. The hemispherical microlens 118a can be obtained since only the center of the exposed portion 118, except an edge thereof, is deformed by surface tension.

It is to be appreciated that the present invention also can be applied in manufacturing other types of microstructures which can be fabricated through an X-ray exposure process.

Figure 3A:
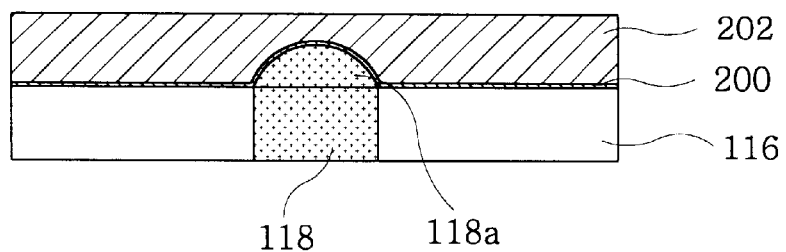
FIGS. 3A to 3C depict a micromold fabrication sequence in accordance with the first preferred embodiment of the present invention.
Figure 3B:
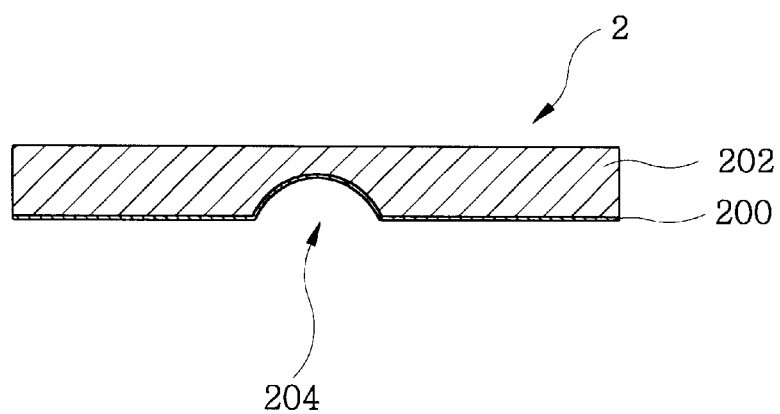
Figure 3C:
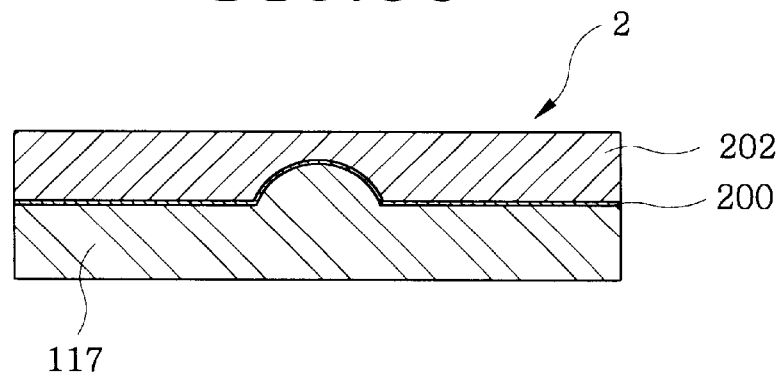

FIGS. 3A to 3C depict a micromold fabrication sequence and molding process in accordance with the first preferred embodiment of the present invention.

Referring to FIG. 3A, a titanium layer 200 is first deposited on top of the microlens 118a and the unexposed portion of the photosensitive material 116. The titanium layer 200 is about 300 Å thick and serves as a base layer for a subsequent Ni plating process. A nickel plating layer 202 is then formed on the titanium layer 200 by the Ni plating process in a Sulphamate-Chloride Nickel plating solution (55° C., pH4).

Thereafter, the microlens 118a, the exposed portion 118 and the photosensitive material 116 are dissolved and removed by an organic solvent, as shown in FIG. 3B, thereby obtaining a micromold 2, e.g., a nickel micromold for a mass-production of microlens structures.

Then, as shown in FIG. 3C, a transparent material, e.g., PMMA or the like, is applied on the micromold 2 and a micromolding or a hot embossing process is performed thereon, enabling the mass-production of the microlens structures 117 of an identical shape.

Figure 4:
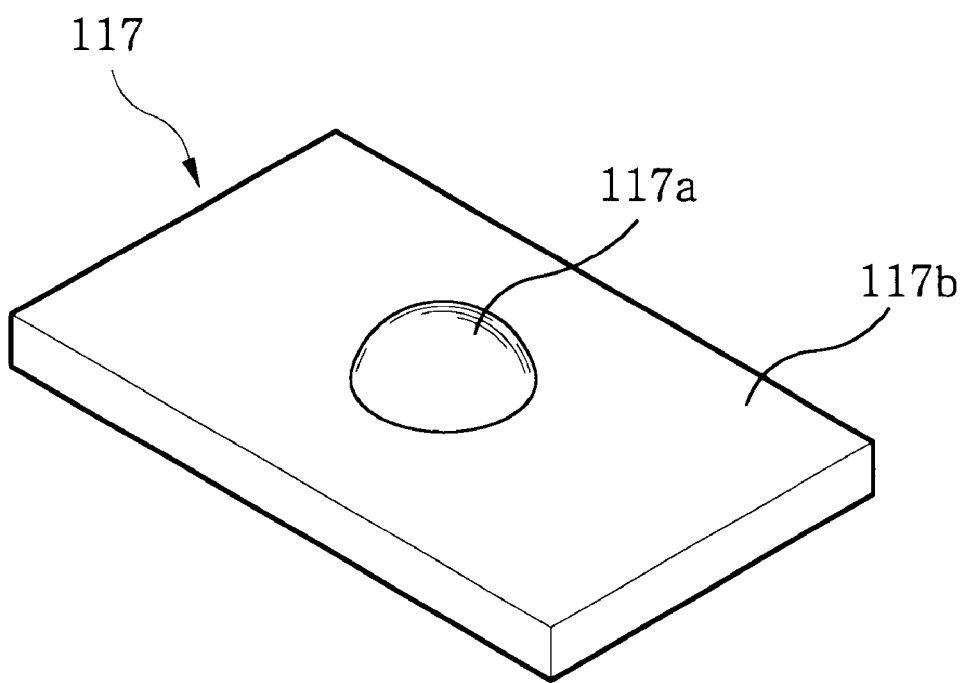
FIG. 4 shows a perspective view of a microlens manufactured by using the micromold fabricated in accordance with the first preferred embodiment of the present invention.

FIG. 4 shows a perspective view of a microlens structure 117 manufactured by using the above described microlens fabrication method. The microlens structure 117 includes a microlens 117a and a base portion 117b.

FIGS. 5A to 5F illustrate an X-ray photomask manufacturing process in accordance with the present invention.

Figure 5A:
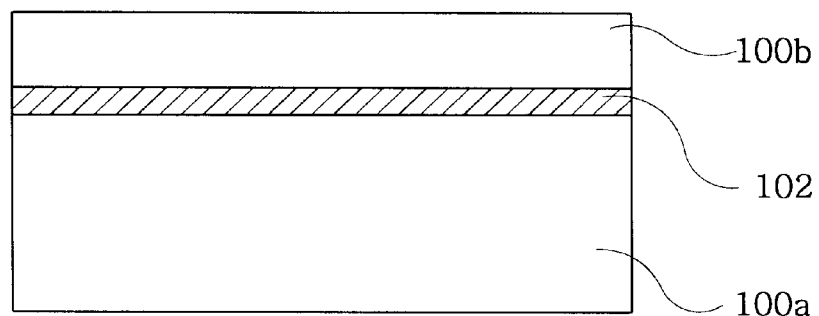
FIGS. 5A to 5F illustrate an X-ray photomask manufacturing process in accordance with the present invention.
Figure 5B:
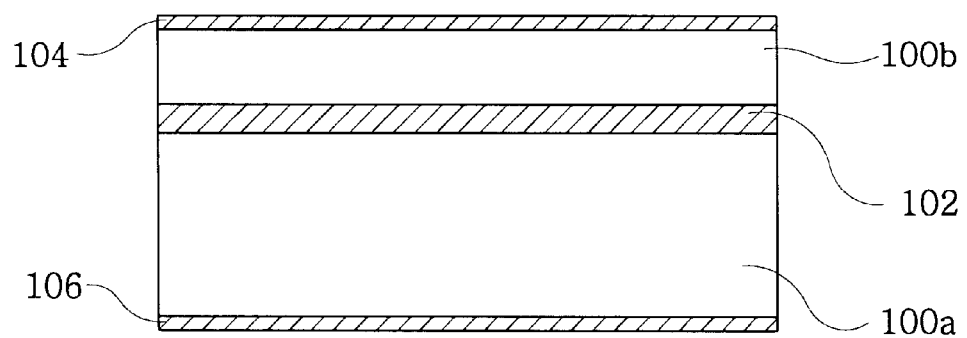

First, referring to FIG. 5A, the X-ray photomask manufacturing step begins with a Silicon-On-Insulator (SOI) wafer having an insulation layer 102 interposed between a bottom silicon layer 100a and a top silicon layer 100b. Preferably, the top silicon layer 100b, the insulation layer 102 and the bottom silicon layer 100a are respectively 20 µm, 1 µm and 400 µm thick.

A first and a second oxide layers 104, 106, each being, e.g., 1 µm in thickness, are then formed on the top and the bottom surfaces of the SOI substrate by performing dry or wet oxidation or the combination thereof. For instance, both of the oxide layers 104, 106 are formed as follows: First, the SOI substrate is loaded into a furnace at about, e.g., 700° C. Thereafter, the furnace temperature is raised to about, e.g., 1050° C. and dry oxidation is performed for 15 minutes followed by wet oxidation for 4 hours and dry oxidation again for 15 minutes at that temperature.

Thereafter, the furnace temperature is lowered down to about, e.g., 700° C. and the substrate is taken out from the furnace.

Figure 5C:
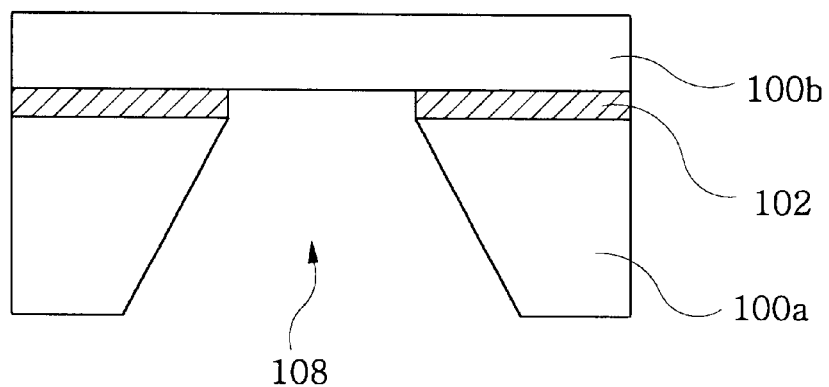

An X-ray radiating area 108 shown in FIG. 5C is then formed though following processes. First, the oxide layer 106 is patterned to expose a central part of the lower surface of the bottom silicon layer 100a. Next, the bottom silicon layer 100a is etched through the patterned oxide layer acting as a barrier layer by performing a bulk micromachining process. In this case, a 20% solution of Tetra Methyl Ammonium Hydroxide (TMAH) can be employed as an etching solution and the bottom silicon layer 100a having the thickness of about 400 µm is etched thereby for 7 hours to expose a central part of the insulation layer 102. Thereafter, the remaining first and the second oxide layers 104, 106 and the exposed central part of the insulation layer 102 are etched away in Buffered Hydrofluoric Acid (BHF) for 30 minutes to end up with the formation of the X-ray radiating area 108 as shown in FIG. 5C.

Figure 5D:
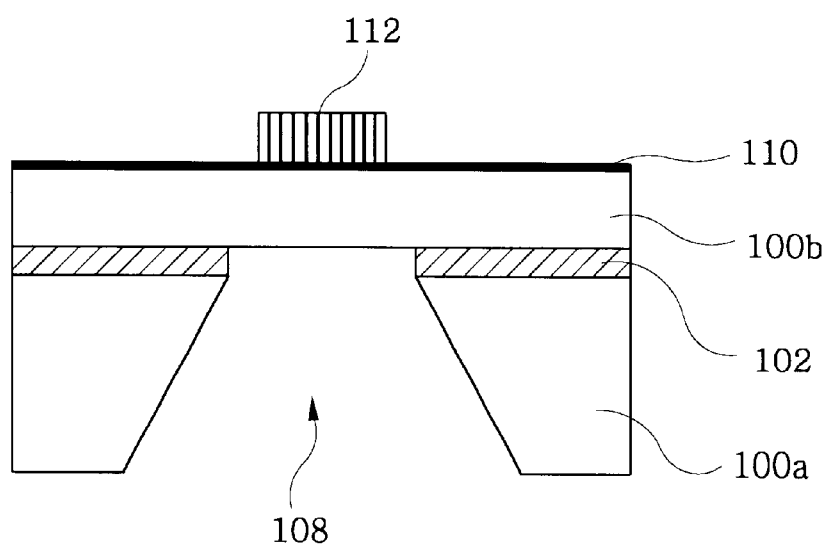
Figure 5E:
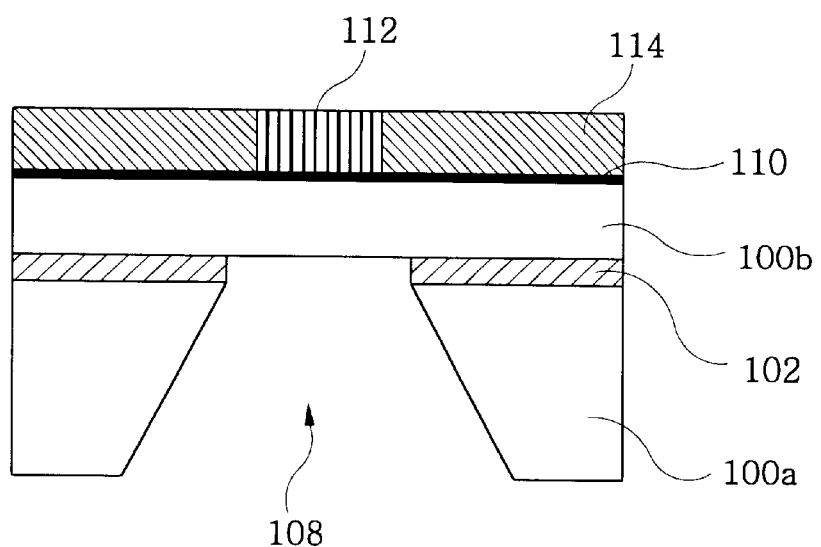

As shown in FIG. 5D, a metallic layer 110 is then deposited on top of the top silicon layer 10b. For example, a Cr/Au metallic layer 110 acting as a seed layer for a subsequent AU electroplating is deposited about 300 Å thick by using a thermal evaporator. Then, a cylindrical photosensitive patterned layer 112 is formed on top of the metallic layer 110 as followed. The cylindrical photosensitive patterned layer 112 can be formed to have a thickness of about 10 µm by, e.g., spin coating at photoresist at 2000 rpm for 60 sec and performing a conventional photolithography process. Thereafter, soft baking is carried out, e.g., at 90° C. for 100 sec.

Subsequently, an X-ray absorbing membrane 114 is formed up to the height of the cylindrical photosensitive patterned layer 112 by, e.g., electroplating a metal layer on the base metallic layer 110. For instance, the X-ray absorbing membrane 114 can be formed by electroplating a Au layer for 2 hours at a current density of 5.5 mA.

Figure 5F:
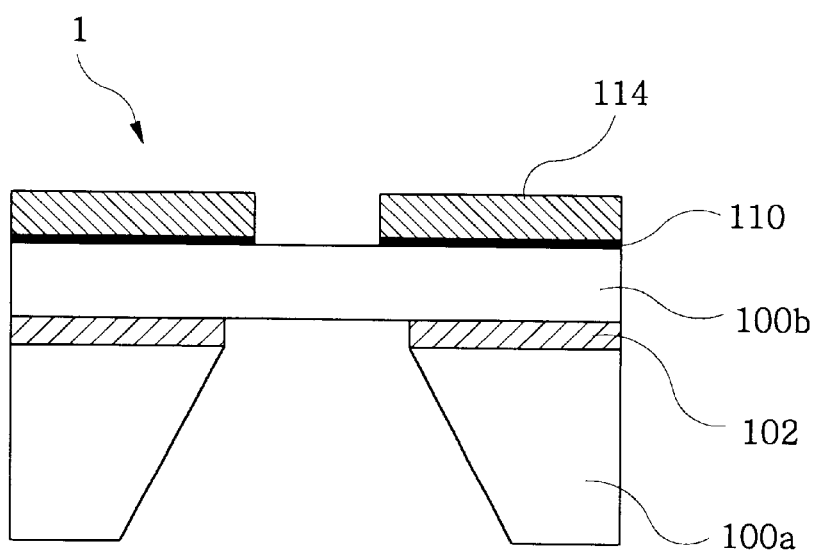

The cylindrical photosensitive material patterned layer 112 is then removed by being sequentially treated in Acetone, Methanol and DI water. Thereafter, by eliminating the exposed portion of the metallic layer 110 positioned at bottom of the removed photosensitive patterned layer 112 by a proper etching solution, the X-ray photomask is obtained as shown in FIG. 5F.

Figure 6A:
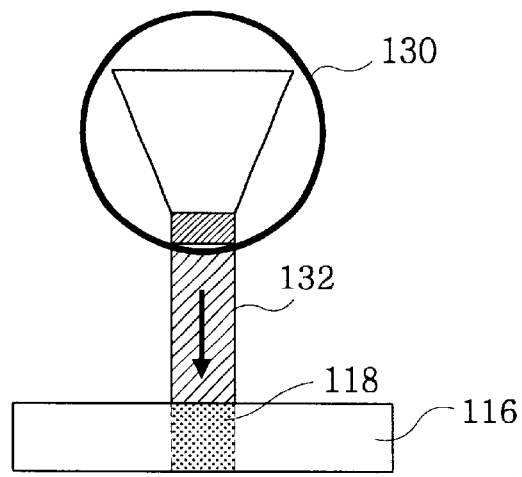
FIGS. 6A to 6B describe a microlens manufacturing process by using laser in accordance with a second preferred embodiment of the present invention.
Figure 6B:
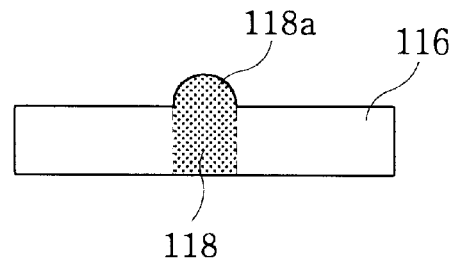

The microlens also can be manufactured by using a laser light source without using a photomask. FIGS. 6A to 6B describe a microlens manufacturing process by using laser in accordance with a second preferred embodiment of the present invention.

First, as shown in FIG. 6A, a predetermined area 118 of the photosensitive material 116, e.g., PMMA, is exposed to a laser beam 132 without any photomask. Such laser exposure is performed, e.g., for 3 to 180 minutes, wherein the laser has an energy level of 2.4 mJ/pulse to 180 mJ/pulse and a frequency of 10 Hz. Therefore, the molecular weight of the PMMA at the exposed portion 118 becomes smaller than that of the nonexposed portion of the photosensitive material 116.

Top surface region of the exposed portion 118 is then melted and deformed by the heat-treatment to form a microlens 118a as shown in FIG. 6B. The heat-treatment is performed at a temperature preferably between about 50° C. and about 250° C. The hemispherical microlens 118a can be obtained since only a center portion of the exposed portion 118, except an edge thereof, is deformed by surface tension.

While the present invention has been shown and described with reference to the particular embodiments, it will be apparent to those skilled in the art that many changes and modifications may be made without departing from the spirit and scope of the invention defined in the appended claims.

What is claimed is:

1. A method for manufacturing a microstructure by using a high energy light source, which comprises the steps of:
   selectively exposing a portion of a photosensitive material to the high energy light source; and
   performing a heat-treatment for melting and deforming only an upper portion of the exposed portion of the photosensitive material.

2. The method of claim 1, wherein the high energy light source is an X-ray.

3. The method of claim 2, wherein the selectively exposing step is carried out by using a photomask for defining a pattern of the microstructure.

4. The method of claim 2, wherein the upper portion of the exposed portion of the photosensitive material is exposed at an energy level between about 1 $kJ/cm^3$ and about 20 $kJ/cm^3$, when being exposed to the X-ray.

5. The method of claim 1, wherein the microstructure includes a single microlens or a plurality of microlenses in the form of an array.

6. The method of claim 1, wherein the high energy light source is a laser.

7. The method of claim 6, wherein the selectively exposing step is performed for 3 to 180 minutes by using the laser having an energy level of 2.4 mJ/pulse to 180 mJ/pulse and a frequency of 10 Hz.

8. The method of claim 1, wherein the microstructure includes a microlens.

9. The method of claim 1, wherein the heat-treatment is performed at a temperature between about 50° C. and about 250° C.

10. The method of claim 1, further comprising, after the step of performing the heat-treatment, the step of manufacturing a micromold and producing a plurality of microstructures with an identical shape by a micromolding or a hot embossing process through the use of the micromold.

* * * * *